United States Patent [19]

Miffitt

[11] 4,282,866
[45] Aug. 11, 1981

[54] BATTERY OPERATED PORTABLE HYDROMASSAGE APPLIANCE

[75] Inventor: Donald C. Miffitt, Chelmsford, Mass.

[73] Assignee: The Gillette Company, Boston, Mass.

[21] Appl. No.: 47,851

[22] Filed: Jun. 12, 1979

[51] Int. Cl.³ .............................................. A61H 9/00
[52] U.S. Cl. ......................................... 128/66; 4/544; 4/492; 4/538; 4/541
[58] Field of Search ............... 4/178, 180, 542, 492, 4/541, 543, 544; 128/66; 340/636

[56] References Cited

U.S. PATENT DOCUMENTS

| | | | |
|---|---|---|---|
| 2,559,678 | 7/1951 | Schroeter | 128/66 |
| 3,034,139 | 5/1962 | Kapnick et al. | 4/178 |
| 3,874,374 | 4/1975 | Jacuzzi | 128/66 |
| 3,961,382 | 6/1976 | Peterson, Jr. | 4/178 |
| 3,965,495 | 6/1976 | McNair | 4/182 |
| 4,086,525 | 4/1978 | Ibsen et al. | 340/636 |
| 4,100,917 | 7/1978 | Talge et al. | 128/66 |
| 4,139,001 | 2/1979 | Macabee | 128/66 |

FOREIGN PATENT DOCUMENTS 2710948  9/1978 Fed. Rep. of Germany ............ 128/66
583802 12/1977 U.S.S.R. ................................... 128/66

Primary Examiner—Robert W. Michell
Assistant Examiner—Arthur S. Rose
Attorney, Agent, or Firm—Raymond J. De Vellis

[57] ABSTRACT

A battery operated portable hydromassage appliance including control circuitry which senses the voltage level of the battery. When the battery voltage is below a predetermined level, the control circuitry automatically shuts the unit off so that the battery may be recharged before irreversible damage to the battery occurs. Also included is a low frequency oscillator which in combination with the low battery detector applies a pulsing input to the motor to turn the pump motor on and off and accordingly create a pulsing effect at the hydromassage appliance output.

9 Claims, 7 Drawing Figures

| A | B | C |
|---|---|---|
| 1 | 1 | 1 |
| 1 | 0 | 0 |
| 0 | 1 | 0 |
| 0 | 0 | 0 |

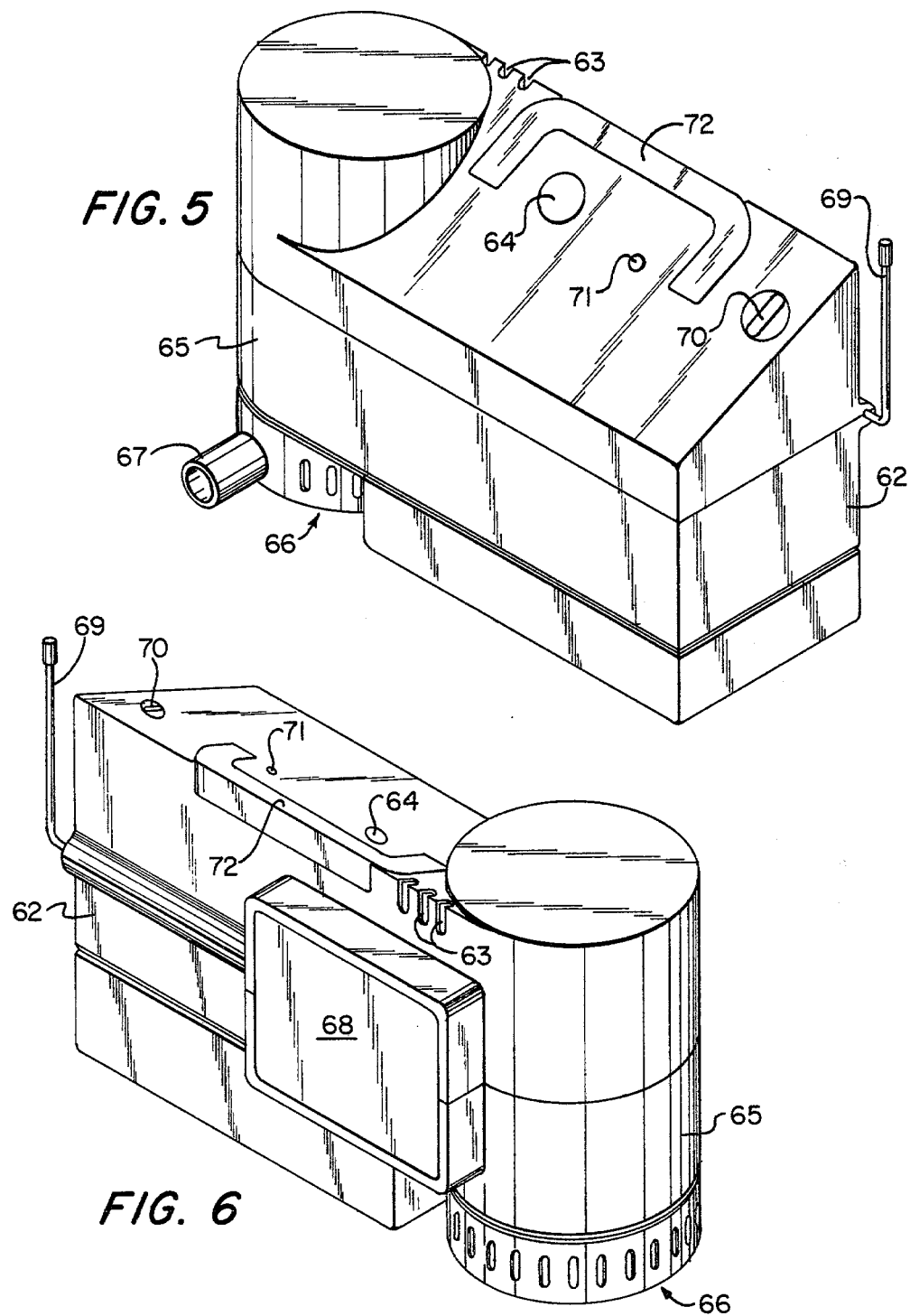

BATTERY OPERATED PORTABLE HYDROMASSAGE APPLIANCE

BACKGROUND OF THE INVENTION

This invention relates to hydromassage type appliances which are battery operated. More particularly this invention relates to a portable compact immersible hydromassage or whirlpool type product which includes control circuitry. The motor of the product is activated in either a continuous or pulsing manner, and electrical shutdown of the device is provided when the rechargeable battery has discharged below a predetermined level.

In the past, whirlpool or hydromassage type appliances were usually rather bulky and powered through a line cord coupled to an associated AC outlet. Such products typically mounted over the side of the tub or were integrally formed with the tub.

In a battery powered portable cordless hydromassage appliance, it is most important from a life of product point of view, as well as consumer satisfaction point of view, not to over discharge the battery. Excessive discharge may cause an irreversible chemical reaction in the battery and render the battery incapable of recovering, by charging, to full battery capacity. Further, in such a compact hydromassage system, it is important that the system be safe, yet remain compact and provide sufficient output features such as a pulsed output.

SUMMARY OF THE INVENTION

It is an object of this invention to provide a battery operated immersible hydromassage type appliance in a safe and cost effective manner.

It is another object of this invention to provide a battery operated compact hydromassage appliance with control circuitry which will prevent the appliance from operating when the battery reaches a predetermined voltage level to preserve the life of the battery.

It is a further object of this invention to provide an electronically controlled hydromassage appliance which electronically prevents the appliance from operating when the battery is too low and also electronically controls the pump motor to provide a pulsed water output when desired, all in a compact cost effective and reliable manner.

Briefly stated, and according to an aspect of this invention, a DC portable hydromassage appliance including control circuitry is provided which permits the user of the appliance to have either a continuous or pulsating output by controlling the input signal to the associated motor. The hydromassage appliance of this invention includes circuitry which senses the voltage level of the rechargeable battery and automatically electrically disconnects the motor/pump from its power source when the voltage level of the battery is at or below a predetermined voltage level which may cause irreversible damage to the battery.

BRIEF DESCRIPTION OF THE DRAWINGS

The invention both as to its organization and principles of operation, together with further objects and advantages thereof, may be better understood by referring to the following detailed description of an embodiment of the invention taken in conjunction with the accompanying drawings in which:

FIG. 5 is a front perspective view showing an embodiment of a compact hydromassage appliance and its major components, in accordance with this invention.

FIG. 6 is a rear perspective view showing an embodiment of a compact hydromassage appliance and its major components, in accordance with this invention.

DETAILED DESCRIPTION

Figures 1, 3:
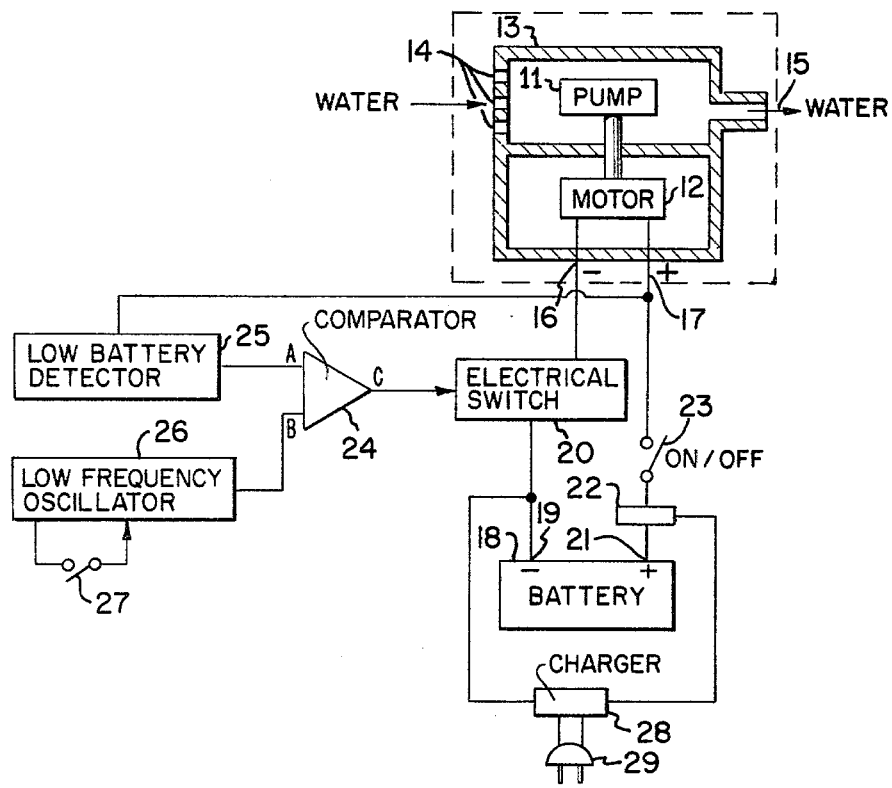
FIG. 1 is a system block diagram of a DC hydromassage appliance and its associated control circuitry, in accordance with this invention.
FIG. 3 is a table indicating generally, on a systems scale, the input-output parameters of the comparator of FIG. 1, in accordance with this invention.

Referring now to FIG. 1, a pump 11 driven by motor 12 is housed generally in housing 13. The system diagram of FIG. 1 illustrates only the pump 11 and motor 12 housed in the housing 13. However, substantially all of the components shown in the system of FIG. 1 are contained in the housing 13 of the hydromassage device.

As is well known in the art, the housing would generally include a plurality of sink holes (not shown) and several inlets, such as inlets 14. The water is drawn through the inlet 14 and disposed out an output such as outlet 15, all in a manner well known in the art.

More specifically, the pump 11 may be a fixed bladed direct drive centrifical pump having a plurality of blades or impellers such as three in number. The impellers themselves are positioned in a matching impeller chamber which may be directionally rotated such as 120° for positioning an associated outlet nozzle. Inlet 14 may be adjustable in size and number and attachments, such as a concentrator, aerator or the like may readily be attached to the outlet nozzle.

The motor 12 is preferably a DC permanent magnet low voltage motor wound for 12 volts at four amps. The size of the motor depends upon the current requirements of its associated pump and the power source. Accordingly, the invention described herein is equally applicable for a six, twelve or other voltage motor. The motor 12 is preferably water cooled, by means well known in the art, and the rate of flow of the fluid through the outlet 15 is controllable by choosing the specific size or diameter of the outlet 15. In a preferred embodiment, the pump 11 and motor 12 combination is capable of 200 hours of running time. The nominal pump outlet volume is 21.5 gallons per minute with a 1,100 feet per minute nozzle velocity.

The motor 12 includes a negative input terminal 16 and a positive input terminal 17. A battery 18, capable of being recharged in a conventional manner, has its negative terminal or cathode 19 electrically connected to the negative terminal input terminal 16 of the motor 12 through an electric switch 20. The positive terminal or anode 21 of the battery 18 is electrically connected to the positive input terminal 17 of motor 12 through an interlock switch means 22 and an on/off switch 23.

When the interlock switch means 22 and the electric switch 20 are both in an electrically conductive posture and the on/off switch 23 is in its on or closed position, a properly energized battery 18 will power the motor 12 which in turn drives pump 11. The battery 18 is preferably a 12 volt 4 ampere hour rechargeable battery such as Model EP1240A rechargeable solid-gel lead dioxide battery with one way venting valves sold by Elpower Corporation of Santa Ana, California. In a preferred embodiment, a fully charged battery will produce 20 to 25 minutes running time of the motor/pump system before recharging is required. The battery 18 is capable of 500 charge/discharge cycles.

A comparator means 24 includes input terminal A and input terminal B and output terminal C. The output terminal C of the comparator 24 is electrically connected to provide an input to the electric switch 20. A signal applied to the electric switch 20 from the output of the comparator 24 biases the electric switch 20 in a manner to render the electric switch 20 conductive or non-conductive depending upon the desired state of the electric switch 20.

The electric switch 20, which electrically connects and disconnects the battery 18 to the motor 12, is a high current switch since the motor 12 of this embodiment requires 4 ampere average. More specifically, a monolithic NPN Darlington transistor is preferable. When an NPN Darlington transistor is utilized, the output of the comparator means 24 is high and the electric switch 20 is conductive. If a PNP Darlington transistor is utilized, the associated comparator 24 will have its output go low to cause the electric switch 20 to conduct, all as is well known in the art.

A low battery detector circuit means 25 has its output electrically connected to input terminal A of comparator 24. The low battery detector 25 is also connected electrically to the positive terminal 21 of the battery 18. A low frequency oscillator circuit means 26, with its associated switch 27, has its output electrically connected to input terminal B of comparator 24. The switch 27 has two modes of operation i.e. continuous output and pulsing output. These modes, which will be described in more detail subsequently, may physically be part of a common switch, such as a three-position rocker switch, with the on/off switch 23.

In operation, when the on/off switch 23 is activated by the user, the low battery detector circuit means 25 with its automatic "power on" clear circuit automatically forces the low battery detector circuit means 25 into the "on" state. When in the "on" state, the low battery circuit means 25 will check to see if the voltage of battery 18 is sufficient to protect the battery 18. If the battery voltage is sufficient, then the low battery detector circuit means 25 outputs a continuous signal to input terminal A of comparator means 24. The comparator 24 turns on the electric switch 20 which in turn controls the motor 12 through negative terminal 16. The motor 12 then turns the pump 11 and forces water through the system.

The low frequency oscillator circuit means 26 has two modes determined by the user by means of an associated oscillator switch 27. If the oscillator switch 27 is in the position for pulsing, such as an open position, a low frequency continuous signal comes from the low frequency oscillator circuit means 26 to the input terminal B of comparator means 24 and actually switches the output of the comparator means 24 on and off. This in turn switches the electronic switch 20 on and off and the motor 12 is turned on and off at about a five hertz rate depending upon the selected components of the low frequency oscillator circuit means 26. If the oscillator switch 27 is in the continuous mode, such as a closed position, the signal going to the comparator 24 means from the low frequency oscillator circuit means 16 forces the output of the comparator means 24 high and into a situation where the electronic switch 20 would be continuously on. Thus, the motor 12 would continuously turn and the pump 11 would continuously pump water.

Although the comparator means 24, which will be described in further detail when referring to FIG. 2, preferably includes an operational amplifier such as available on a LM324 quad op amp chip manufactured by National Semiconductor and others, other types of circuitry such as those including flip flop logic, all well known in the art, may be utilized provided they have the proper output impedance and the capability of driving the electric switch 20.

In operation, when the unit is running in the continuous or steady mode, the voltage of the battery is constantly measured to determine when the battery should be recharged. When the battery reaches a predetermined level such as 10.9 volts, the motor is shut off and an associated indicator such as light or LED is turned on to indicate to the consumer that the battery needs recharging.

With the unit running in the pulsing mode, the motor is turned on and off at a predetermined rate thereby producing a pulsed water flow at the nozzle. The associated light will flash at the same predetermined rate whenever the unit is operated in the pulsing mode. The battery voltage is continuously measured and when the battery discharges to the predetermined level, the light goes from flashing to a steady "on" to indicate the need for recharging.

The general operation of the system with respect to the outputs of the low battery detector circuit means 25 and the low frequency oscillator circuit means 26, as they ultimately control the electric switch 20, is shown by referring to the systems input-output table of FIG. 3. The low battery detector circuit means 25 may be used in the system without any low frequency oscillator circuit means 26. In such a case, the output of the low battery detector circuit means 25 could directly control the state of the electric switch 20 to ultimately shut off the system when the predetermined level of voltage of the battery 18 was reached. Thus when the low frequency oscillator circuit means 26 is in the continuous position, its output signal will always be high and the output of the comparator means 24 will be solely controlled by the output from the low battery detector circuit means 25.

In operation, regardless of the continuous output signal of the low frequency oscillator circuit means 26 to the comparator means 24 i.e. high or alternating between high and low (pulsing), the system will be electrically disconnected from the battery 18 whenever the low battery detector circuit means 25 senses too low a voltage across the battery 18. This condition would cause the low battery detector circuit means 25 to provide a low signal to the input terminal A of comparator means 24 which would render the electric switch 20 non-conductive.

Assuming the low battery detector circuit means 25 senses a voltage above the predetermined threshold, then its output, at input terminal A of comparator means 24, will be high and the signal from the low frequency oscillator circuit means 26 will determine whether the motor 12 will be continuously driven or switched on and off at a predetermined rate.

Referring back to FIG. 1, a standard charger system 28 is shown with its accompanying AC male member or plug 29. Plug 29 is capable of being plugged directly into an associated AC outlet. The charger system 28 is electrically connectable across the terminals 19 and 21 of the battery 18. However, for the sake of safety and to substantially prevent the system from being charged while immersed in water, an interlock switch means 22 is provided. A plug cap assembly (not shown) must be removed from the housing of the device to give access to a female connector or jack of the associated charger system 28. When the plug cap assembly is removed, the anode 21 is electrically disconnected from the on/off switch 23. Accordingly, the motor 12 is electrically disconnected whenever the battery 18 is charged. Preferably a single pole switch is associated with the interlock switch means 22 so that when the plug cap assembly is removed, the circuit between the battery 18 and the motor 12 is opened and the motor 12 is not powered during the recharging of the battery.

More specifically, the charger means 28 may be of any well known type such as having an input of 120 volts AC, 60 hertz with an output of 12 to 15 volts AC. Preferably the charger means 28 is of the current limiting variety which includes an automatic trickle mode so that the battery 18 cannot be overcharged.

Figure 2:
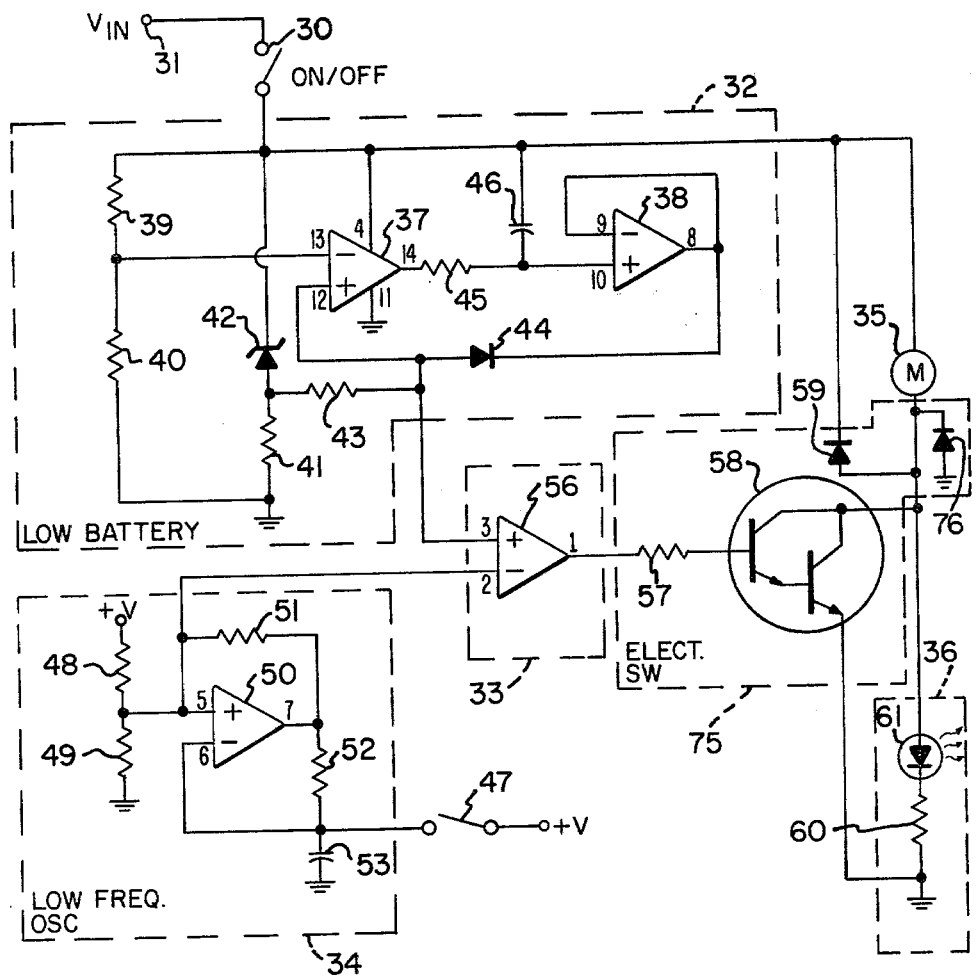
FIG. 2 is a schematic representation of an embodiment of the DC hydromassage appliance showing more specifically the components of the electronic control circuitry, in accordance with this invention.

Referring now to the more detailed circuit of FIG. 2, the hydromassage includes a manually actuated on/off switch 30. Switch 30 activates the control circuit which is powered by a DC source such as a battery 31. The on/off switch 30 is electrically connected to a low battery detector circuit 32 which provides a first signal input to a comparator means 33. The low frequency oscillator circuit 34 provides a second signal input to the comparator means 33. The output of the comparator means 33 is electrically connected to an electric switch 75. When the electric switch 75 is in its conducting mode, it electrically connects the hydromassage pump/motor 35 to the battery 31. A visual display means circuit 36 gives the user visual indication of the operating characteristics of the system.

Referring now more specifically to the low battery detector circuit 32, operational amplifier 37, which has a comparator function, and operational amplifier 38, which has a buffer function, may both be formed from the LM324 quad amp chip previously described with the pin connections such as noted in FIG. 2. The negative input of operational amplifier 37 is electrically connected between a 6.2 Kohm resistor 39 and a 4.7 Kohm resistor 40. Resistors 39 and 40 make up a resistor divider circuit. A 270 ohm biasing resistor 41 is connected in series with a 1N5234 Zener diode 42 to on/off switch 30. A 1 Kohm buffer resistor 43 is electrically connected between the resistor 41 and Zenor diode 42 and the positive input of operational amplifier 37. Also connected to the positive input of operational amplifier 37 is the anode side of a 1N4148 diode 44. The positive input of operational amplifier 37 is further electrically connected to the positive input of comparator means 33. The cathode side of diode 44 is electrically connected to the output of operational amplifier 38. As shown in FIG. 2, the output of operational amplifier 38 is also electrically connected back to the negative input of operational amplifier 38.

An RC filter made up of a 200 Kohm resistor 45 and a 0.2 microfarad capacitor 46 is included in the low battery circuit 32. The output of the operational amplifier 37 is electrically connected to resistor 45 which in turn is electrically connected to capacitor 46 and the positive input of operational amplifier 38. The other end of capacitor 46 is electrically connected through switch 30 to battery 31.

In general, the low battery detector circuit 32 continuously measures the voltage of the rechargeable battery 31 against a reference such as Zenor diode 42. Since there is noise in the circuit, the low battery detector circuit 32 includes an RC filter made up of resistor 45 and capacitor 46 to average the battery voltage that the low battery detector circuit 32 is sensing. When the battery voltage drops below a predetermined level for a period of time determined by the RC filter, a low output signal is applied to the positive input of comparator means 33 which ultimately turns off the motor 35. The threshold of the circuit is now also changed such that even if the battery voltage increases, the output from the low battery detector circuit 32 remains low.

More specifically, the resistor divider made up of resistors 39 and 40 provides a voltage which is proportional to the battery voltage and presents that voltage to the negative input of the operational amplifier 37. This voltage is compared against the voltage of the Zenor diode 42 at 6.2 volts which in turn goes through a buffer resistor 43 to the positive input of operational amplifier 37. When the battery voltage drops below a predetermined level such as 10.9 volts, the output of operational amplifier 37 would then go low. The RC filter filters out the noise coming into the system mainly from the motor 35.

The operational amplifier 38 buffers the signal from the RC filter and the resulting signal is then fed through diode 44 into the positive input of operational amplifier 37. Once the output from the operational amplifier 37 goes low and after the delay caused by the RC filter, the operational amplifier 38 goes low and pulls a reference on the plus input of operational amplifier 37 down such that the circuit latches. The circuit remains in the off condition no matter how high the voltage goes in the positive direction from that point.

The capacitor 46 has both a filtering and a "power-on" function. Because the brushes of motor 35 may be pulsating at very high currents and accordingly introduce very large voltage transients on the battery supply line, the resulting signal must be averaged in order to get an accurate reading as to voltage levels. As a "power-on" function, the capacitor 46, which is initially discharged, remains discharged just after power is applied and takes a time period determined by the value of the resistor 45 and capacitor 46 before the capacitor 46 charges up. Therefore, the input to the operational amplifier 38 is pulled high by the capacitor 46 and remains high until the system settles out and then starts to do its compare function.

An on/off switch 47 is electrically coupled to the low frequency oscillator circuit 34. When the on/off switch 47 is in its on or open position, the low frequency oscillator circuit 34 will be in its pulsating mode. When the switch 47 is in its closed or off position, the low frequency oscillator circuit 34 will provide a continuous high signal to the negative input of comparator means 33.

Electrically connected between 100 Kohm resistors 48 and 49 is the positive input of operational amplifier 50. As is the case with all operational amplifiers in this circuit, the pin designations are those illustrated for an LM324 quad amp chip. Connected between the output of operational amplifier 50 and its positive input is a 100 Kohm feedback resistor 51. The output of low frequency oscillator circuit 34 is also electrically connected between the positive input of operational amplifier 50 and the negative input of comparator means 33. The negative input of operational amplifier 50 is connected between a 300 Kohm resistor 52, which is in turn connected to the output of operational amplifier 50, and to a 0.47 microfarad capacitor 53, the other end of which is connected to ground.

Figure 4A:
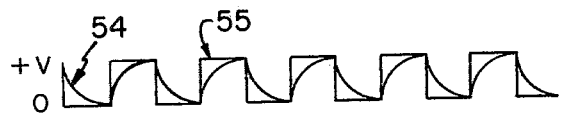
FIG. 4A is a wave form illustrating a signal appearing across the capacitor superimposed over a reference signal at the plus input of an operational amplifier of a low frequency oscillator, in its pulsating mode, in accordance with FIG. 2 of this invention.
Figure 4B:
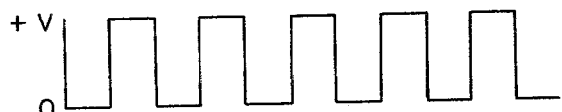
FIG. 4B is a wave form illustrating a signal appearing at the output of the operational amplifier of the low frequency oscillator, in the pulsating mode, in accordance with FIG. 2 of this invention.

In operation and referring to the wave forms of FIGS. 4A and 4B, the low frequency oscillator circuit 34 is configured to charge and discharge capacitor 53. As this occurs, the reference on the plus input of operational amplifier 50 is changed such that it would be $\frac{1}{3}$ and $\frac{2}{3}$'s of the battery voltage. The range of frequency would be between 2 and 20 cycles per second and preferably 5 cycles per second.

The square wave form of FIG. 4B shows the signal occuring at the output of operational amplifier 50. This voltage wave form is supplied to resistor 52 which is charging and discharging capacitor 53. When the output voltage wave form at the output of operational amplifier 50 is negative, the capacitor is charged in a negative sense from the $\frac{2}{3}$'s value of the battery voltage down toward the $\frac{1}{3}$ level of battery voltage. When that input level is reached, the output level switches in the opposite direction and the capacitor 53 stops discharging and then starts to charge. The feedback resistor 51 that is electrically connected to the divider resistors 48 and 49 provides hysteresis for the oscillator.

The curved wave form 54 of FIG. 4A is that of the capacitor 53. The square wave form 55 of FIG. 4A is the threshold signal coming from the reference made up of the feedback resistor 51 and the divider resistors 48 and 49.

Referring back to FIG. 2, the comparator means 33 basically comprises another of the operational amplifiers from the LM 324 quad op amp chip with its pin connections indicated, such as operational amplifier 56. In general, the output of operational amplifier 56 will only properly bias the electric switch 75 when it receives the proper signal from the low battery detector circuit 32 and from the low frequency oscillator circuit 34 through its positive and negative inputs respectively. The low battery detector circuit 32 will deliver the proper signal only when it senses that the battery voltage has not discharged below the predetermined level. The low frequency oscillator circuit 34 will always send an output signal indicative of an on condition when its associated switch 47 is in the closed or continuous position. When the switch 47 is in the pulsating position, the signal presented to the negative input of operational amplifier 56 will be a square wave. The square wave signal will, at a predetermined frequency such as 5 cycles per second, switch the operational amplifier 56 and the electric switch 75 on and off to activate the motor 35 in a pulsating mode.

The output of the comparator means 33 is electrically connected through a current limiting 1.2 Kohm buffer resistor 57, to the base of a Darlington G.E. D44E1 transistor 58. In operation, when the appropriate signal is at the output of the comparator means 33, the transistor 58 is properly biased and conducts thereby electrically connecting the battery 31 to the motor 35.

The collector of the transistor 58 is electrically connected through 1N4001 protection diodes 59 and 76 to a terminal of the motor 35. The emitter and third lead of transistor 58 are connected across the series combination of a 470 ohm $\frac{1}{2}$ watt current limiting resistor 60 and LED 61 which make up the visual display means circuit 36. The visual display means circuit 36 with its LED 61 will be "on" whenever the system is off. In addition, when the low frequency oscillator circuit 34 is in its pulsing mode and the system is on, the LED 61 will pulsate. When the system is off, the LED 61 will accordingly be on.

Referring now to FIGS. 5 and 6, a DC portable hydromassage appliance is shown comprising a housing 62 containing a plurality of sink holes 63. The housing 62 may be molded of plastic or the like. Disposed through the housing 62 is a switch 64 which may be a single rocker switch including the functions of the previously described on/off switch and the pulsating switch of the oscillator.

Internal to the housing 62 is a pump powered by a motor. The motor has been previously described and preferably includes a water tight bearing system. The pump includes impellers or blades which are disposed in an impeller chamber 65.

In operation, water is drawn through an inlet opening 66 and expelled through air outlet or nozzle 67. The impeller chamber 65 may be directionally rotated 120° for positioning the outlet nozzle 67. The hydromassage appliance is fully emersible and may include means for attaching the whirlpool to the side of the tub or the like such as vacuum grip means 68 which would be activated in the manner well known in the art by means of a lever arm 69.

Shown on the top of housing 62 is a plug cap 70 which forms part of the interlock switch described previously. When the plug cap 70 is removed, the circuit is electrically disconnected from the motor. The female receptacle associated with the plug cap 70 and accessable when the plug cap 70 is removed, such as by unscrewing, is adapted to receive a jack of an associated charger. The battery contained in the housing 62 is rechargeable while remaining in the housing 62. However, if the battery has to be replaced, it may be accessed by removing an associated cover plate. Of course, the electrical system is disposed inside the housing 62 and waterproof by means such as potting. The battery terminals are likewise protected, all in a manner well known in the art. Finally, located at the top of housing 62 is a LED 71 which provides a visual indication of the appliance state and a handle 72.

While an embodiment and application of the invention has been shown and described, it will be apparent to those skilled in the art that many more modifications are possible without departing from the inventive concepts herein described. The invention, therefore, is not to be restricted except as is necessary by the prior art and by the spirit of the appended claims.

What is claimed as new and desired to be secured by United States Letters Patent is:

1. A hydromassage appliance comprising a housing having an inlet and an outlet;

a water pump positioned in said housing for drawing water from said inlet and expelling water from said outlet;

DC motor means positioned in said housing and mechanically connected to said water pump for driving said water pump in response to an electrical signal;

a rechargeable DC source positioned in said housing and electrically connectable to said motor means for providing the electrical signal;

comparator means for comparing first and second signals and for providing an output;

electric switch means positioned in said housing and electrically connected to said output of said comparator means for electrically disconnecting said motor means in response to a predetermined signal;

low battery detector means electrically connected to said comparator means and positioned in said housing for electrically determining the voltage level of said DC source, said low battery detector means also being capable of generating said first signal to said comparator means in response to the sensed level of voltage of said DC source, said first signal being indicative of the level of voltage of said DC source being at or above a predetermined level; and electrical frequency oscillator means positioned in said housing for providing a pulsed second signal to said comparator means such that said comparator means bias said electrical switching means in accordance with said pulsed second signal and allow said motor means to be alternatively electrically connected and disconnected in a pulsating manner to said DC source at a rate of about five hertz when said first and second signals are received from said low battery detection circuit means and said frequency oscillator means respectively whereby a pulsed water output is created.

2. The appliance as in claim 1 wherein said oscillator means is a low frequency oscillator means and includes a resistor-capacitor oscillator.

3. The appliance as in claim 2 further including a oscillator switch means electrically connected to said low frequency oscillator means having a first and second position, when said oscillator switch means is in said first position, the output of said oscillator means is a pulsing signal and when said oscillator switch means is in said second position, the output of said oscillator means is at a level which renders the output of said comparator means dependent on said first signal produced from said low battery detector means.

4. The appliance as in claim 3 wherein said electric switch is a Darlington transistor.

5. The appliance as in claim 4 further including an on/off switch means positioned through an aperture in said housing for electrically connecting said DC source to said motor.

6. The appliance as in claim 5 wherein said rechargeable DC source is a 12 volt battery and said motor means is a 12 volt permanent magnet water cooled motor.

7. A hydromassage appliance comprising a housing including an inlet and an outlet;

a water pump positioned in said housing for drawing water from said inlet and expelling water from said outlet;

DC motor means positioned in said housing and mechanically connected to said water pump for driving said water pump in response to an electrical signal;

a rechargeable DC source positioned in said housing and electrically connectable to said motor means for providing the electrical signal;

low battery detector means positioned in said housing for sensing the voltage level of said DC source and for electrically disconnecting said motor means from said DC source when a predetermined voltage level of said DC source is sensed; and electrical low frequency oscillator means electrically connected to said motor means for providing a pulsed input electrical signal to said motor means which switches said motor means on and off at a rate of about five hertz whereby a pulsed water output is created.

8. The appliance as in claim 7 wherein an electric switch means positioned in said housing is electrically connected to said low battery detector means and said low frequency oscillator means and said motor means for electrically disconnecting said motor means in response to an input signal indicative of a sensed voltage level of said DC source below the predetermined voltage level of said DC source.

9. The appliance as in claim 8 wherein said low frequency oscillator includes an electrically connected switch having a continuous mode and a pulsing mode.

* * * * *